United States Patent [19]

Gay

[11] 4,338,580
[45] Jul. 6, 1982

[54] SELF BALANCING AMPLITUDE MODULATOR

[75] Inventor: Michael J. Gay, Geneva, Switzerland

[73] Assignee: Motorola, Inc., Schaumburg, Ill.

[21] Appl. No.: 148,349

[22] Filed: May 9, 1980

[51] Int. Cl.³ .......................... H03C 1/06; H03C 1/36
[52] U.S. Cl. ............................... 332/31 T; 332/37 D; 332/43 B; 358/23; 455/108
[58] Field of Search ................ 332/16 T, 31 T, 37 D, 332/43 B; 455/108; 358/23, 24, 25, 40

[56] References Cited

U.S. PATENT DOCUMENTS 3,852,688 12/1974 Takeda ........................ 332/43 B X
3,887,886 6/1975 Okada et al. ....................... 332/43 B

*Primary Examiner*—Siegfried H. Grimm
*Attorney, Agent, or Firm*—Michael D. Bingham

[57] ABSTRACT

A modulator receiving an analog input signal and a switching signal for providing an amplitude modulated output signal. The modulator includes a differential input amplifier coupled to a multiplier wherein the analog input signal is commutated through a load resistor by the switching signals that are supplied to the multiplier. A gating circuit is coupled to the multiplier whereby the analog input signal is commutated to a feedback circuit coupled between the gating circuit and the second input of the differential input amplifier. The feedback circuit produces an output for adjusting the bias potential at the second input of the differential input amplifier to equalize the differential output currents therefrom when the analog input signal is set to a nominal zero level and the gating circuit is activated.

16 Claims, 3 Drawing Figures

4,338,580

SELF BALANCING AMPLITUDE MODULATOR

BACKGROUND OF THE INVENTION

This invention relates to modulator circuits and more particularly to a self balancing modulator for eliminating direct current offset errors at the output thereof when the modulator is in a balanced operating mode.

Modulator circuits for modulating a subcarrier frequency by an information containing signal are well known in the art. One type of prior art modulator comprises a differential input amplifier adapted to receive the information carrying input signal with differential outputs thereof coupled respectively to a pair of differentially connected transistor pairs having their collectors interconnected such that in response to the subcarrier frequency or switching signal applied to the bases of the respective transistor pairs there appears at the output of the modulator the subcarrier frequency amplitude modulated by the information carrying input signal.

A specific application utilizing a modulator of the type aforedescribed is PAL-Secam Television Chroma Decoding Systems in which the Secam chroma information is remodulated onto a Pal frequency or other subcarrier frequency before being applied to a commutator. It is well known to those in the art that in typical Secam television receiver systems the Secam chroma information is generally applied to a frequency discriminator at the output of which appears a demodulated Secam chroma information signal which must be synchronized in accordance with standard techniques. In order to effect this synchronization alternate frequency sequences are produced by supplying the output of the aforementioned frequency discriminator directly and indirectly through a delay line as is understood. Typical delay lines used in contemporary Secam television chroma decoding systems require that the Secam chroma information signal be used to remodulate a subcarrier frequency before being applied to the delay line. The remodulator must be extremely well balanced so that the residual levels of the subcarrier are very low: a residual level represents a black level error. A manual adjustment of the modulator to reduce residual levels is not desirable in television receiver systems and therefore some automatic balancing techniques must be applied. Thus, there exists a need to provide a self balancing modulator such that with the Secam chroma information being at a zero level the output of the modulator will be substantially zero in order to prohibit any output offset errors.

SUMMARY OF THE INVENTION

It is an aspect of the present invention to provide an improved modulator of the type generally discussed above wherein offset errors are substantially eliminated.

It is another aspect of the present invention to provide a self balancing modulator incorporating a feedback loop for nulling the output thereof whenever the input is at a zero reference level.

Still another aspect of the present invention is to provide a self balancing modulator suitable for use in television chroma demodulator systems for inhibiting black level errors which may otherwise occur therein.

In accordance with the foregoing and other aspects there is provided in the present invention a self balancing modulator generally including an input differential amplifier and multiplier section and further comprising a feedback loop for self adjusting a bias voltage applied to one input of the input differential amplifier whereby the bias voltage is adjusted for a null such that when the input signal, applied to the other input of the input differential amplifier, is at a nominal zero level the output from the modulator is also zero.

DESCRIPTION OF THE DRAWINGS

The present invention is explained with the aid of the following drawings.

DESCRIPTION OF THE SPECIFIC EMBODIMENT

Figure 1:
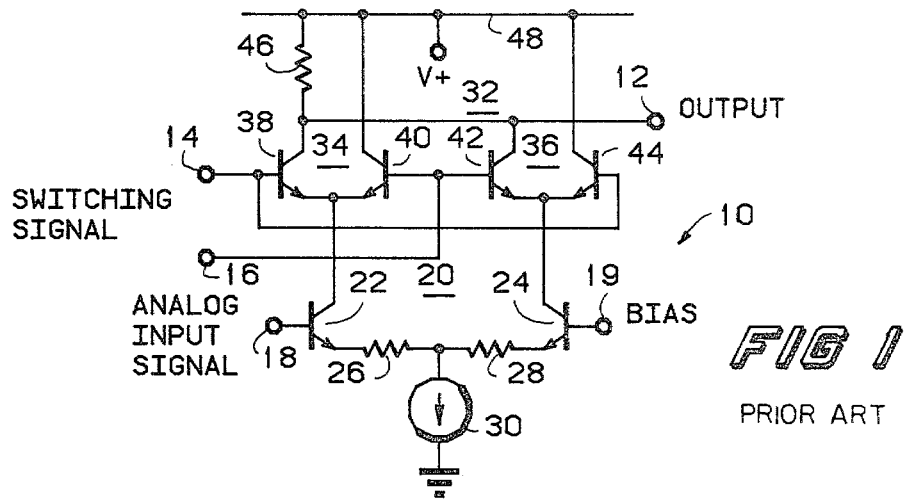
FIG. 1 is a schematic diagram of a modulator generally known in the art which is useful for explaining the problems therewith.

Turning to FIG. 1 there is shown modulator 10 generally well known to those skilled in the art. Modulator 10 provides an amplitude modulated, AM, output signal at output terminal 12 at a subcarrier frequency of the switching signals applied at terminals 14 and 16 in response to the analog input signal applied at terminal 18. As shown, modulator 10 includes differential input amplifier 20 comprising transistors 22 and 24 having respective emitters thereof coupled, via resistors 26 and 28, to a common node at which a current source 30 is connected. The base of transistor 22 is adapted to be coupled to input terminal 18 of modulator 10 whereas the base of transistor 24 is adapted to receive a bias potential thereat at terminal 19. The differential currents appearing in the collector outputs of transistor 22 and 24 are supplied to multiplier section 32 which includes differentially connected transistor pairs 34 and 36 respectively. As illustrated, the collector of transistor 22 is connected at the differentially connected node between the emitters of transistors 38 and 40 of transistor pair 34; the collector output of transistor 24 is connected to the differentially connected node between the emitters of transistors 42 and 44 of the second transistor pair 36. The bases of transistors 38 and 44 are interconnected to terminal 14 and the bases of transistors 40 and 42 are interconnected to terminal 16. The collectors of transistors 38 and 36 are interconnected at output terminal 12 and are coupled, via resistor 46, to a power supply conductor 48 at which is supplied a source of operating potential V+. The collectors of transistors 40 and 44 are returned to power supply conductor 48.

As understood, the differential currents flowing in the collectors of transistors 22 and 24, as a result of the analog input signal applied to input terminal 18, are commutated by the switching signals applied to multiplier section 32 to appear alternately through resistor 46. Thus, it is clear that the output signal appearing at output terminal 12 occurs at the frequency of the switching signal (subcarrier frequency) and is amplitude modulated by the differential currents produced in accordance with the applied analog input signal.

As previously discussed, i.e., in color television chroma demodulator systems it is desirous to reduce any offset errors occurring at the output of the aforedescribed modulator when the analog input signal is at a nominal zero level. This means that the zero level of the analog input signal must be adapted to the bias level applied at terminal 19 of modulator 10, modified by any mismatch and offset errors, if the zero analog signal is to generate a zero output signal at terminal 12. In many cases adequate performance will not be achieved without either manual or automatic adjustment.

One method of automatic adjustment may be realized by utilizing a feedback loop and periodically setting the analog input signal to its nominal zero level. Activating the feedback loop, with the input signal set to zero, to monitor the output signal to adjust the bias potential at node 19 for a null is one technique that may be used. However, an alternative method, considered hereinafter which is simpler, is to again set the analog signal periodically to its nominal zero level and then divert the collector currents of transistors 22 and 24 into a feedback circuit to adjust the bias potential to equalize these two currents. Since the modulator output comprises these two currents commutated by the switching signal, equalizing them corresponds to nulling the output. The present invention utilizes this technique and will be described hereinafter in reference to FIG. 2 and FIG. 3.

Figure 2:
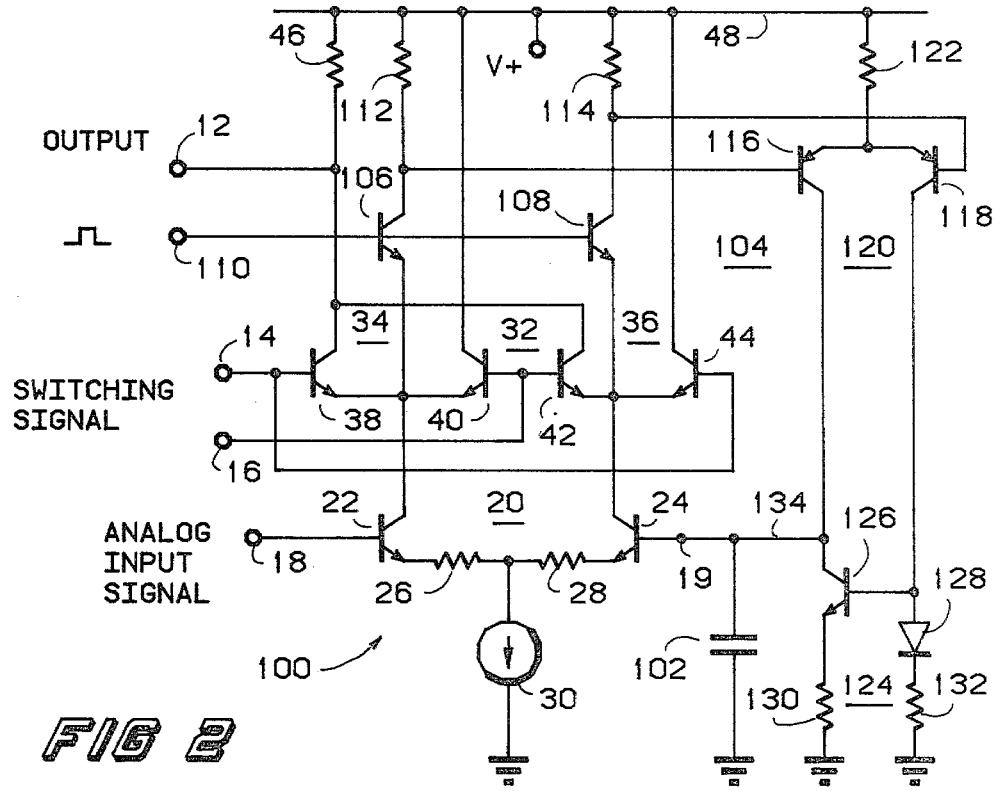
FIG. 2 is a simplified schematic diagram of the embodiment of the present invention.

FIG. 2 illustrates a modulator of the type shown in FIG. 1 utilizing the feedback techniques explained above. Components illustrated in FIG. 2 corresponding to like components in FIG. 1 are designated with the same reference numerals.

Modulator 100 is shown as including input differential amplifier 20 for receiving the analog input signal at terminal 18 with the outputs thereof coupled to the differential nodes of transistor pairs 34 and 36 of multiplier 32, as previously explained. The differential currents flowing in the collectors of transistors 22 and 24 are commutated by the switching signals applied to terminals 14 and 16 of multiplier section 32 and flow through resistor 46 to produce the output signal at terminal 12. The bias potential supplied at terminal 19 is provided by the voltage developed across capacitor 102. A feedback circuit 104 is provided for self balancing modulator 100 as briefly explained above. A pair of transistors 106 and 108 which act as diversion gates as will be explained supply inputs to feedback circuit 104. The respective emitters of transistors 106 and 108 are connected respectively to transistor pairs 34 and 36 of multiplier section 32 at the differentially connected emitters of each transistor pair. The bases of transistors 106 and 108 are coupled to an input terminal 110 at which an adjustment cycle pulse is supplied. The respective collectors of transistors 106 and 108 are coupled through resistors 112 and 114 to power supply conductor 48 and also to the inputs of transistors 116 and 118 comprising differential amplifier 120. The emitters of transistors 116 and 118 are returned to power supply conductor 48 through resistor 122 with the collectors thereof coupled to a current mirror circuit 124 comprising transistor 126, diode 128, and resistors 130 and 132. As known in the art, current mirror circuit 124 converts the differential collector currents in transistors 116 and 118 to a single-ended output which is coupled via lead 134 to capacitor 102 to charge the same in accordance with the following operation.

In normal operation, the bases of transistors 106 and 108 are held at a potential sufficiently low to prevent these two transistors from conducting such that no voltage is developed across resistors 112 and 114. Hence, transistors 116 and 118 of differential amplifier 120 are biased in a non-conducting state as are transistors 126 and diode 128 of current mirror circuit 124. Hence, if capacitor 102 is of sufficiently large size such that it does not discharge significantly, because of base current of transistor 24, the bias voltage stored thereacross during the previous adjustment period will be retained. In this mode of operation the analog input signal applied at input terminal 18 causes a differential current flow in the collectors of transistors 22 and 24 which are fully commutated by multiplier section 32 in response to the switching signals applied at terminals 14 and 16 and will alternately flow through resistor 46 producing the desired output signal. This output signal comprises the differential current modulated by the switching signal. It is assumed that the output signal appearing at terminal 12 will be zero whenever the analog input signal level is such as to produce equal collector current in transistors 22 and 24 of amplifier section 20, i.e., zero differential currents.

During the sequential adjustment period a pulse is applied to terminal 110 to the bases of transistors 106 and 108 rendering them conductive so as to divert all of the differential currents flowing in the collectors of transistors 22 and 24 therethrough and hence through resistors 112 and 114 respectively. Further, assuming that resistors 112 and 114 are substantially equal in value, the voltages developed thereacross are sufficient to bias differential amplifier 120 into conduction. As understood, the collector current through transistor 118 is inverted through current mirror circuit 124 to flow through the collector and emitter of transistor 126 which subtracts from the collector current flowing through transistor 116. Ideally, if the currents through resistors 112 and 114 are equal, no differential voltage is developed between the bases of transistors 116 and 118 and the collector currents therefrom are equal. In this condition, since the collector current of transistor 116 equals the collector current of transistor 118, which is subtracted therefrom, no current flow is produced via lead 134 to capacitor 102. Therefore, if during the adjustment period the analog input signal is placed at its nominal zero level such that equal currents flow in the collectors of transistors 22 and 24, the voltage across capacitor 102 will remain constant. However, if the currents in transistors 22 and 24 are not equal when the analog input signal is set at its nominal zero level during the adjustment period there will be a differential voltage established across the inputs of differential amplifier 120 which will cause a net current flow at the output of current mirror 124 via lead 134 of predetermined sense. Thus, there will be a consequent change in the voltage stored upon capacitor 102 of the correct sense to change the bias on transistor 24 to equalize the collector currents flowing in transistors 22 and 24 whereby the modulated output signal appearing at output terminal 12 will be zero whenever the analog input signal is at its nominal zero level.

Figure 3:
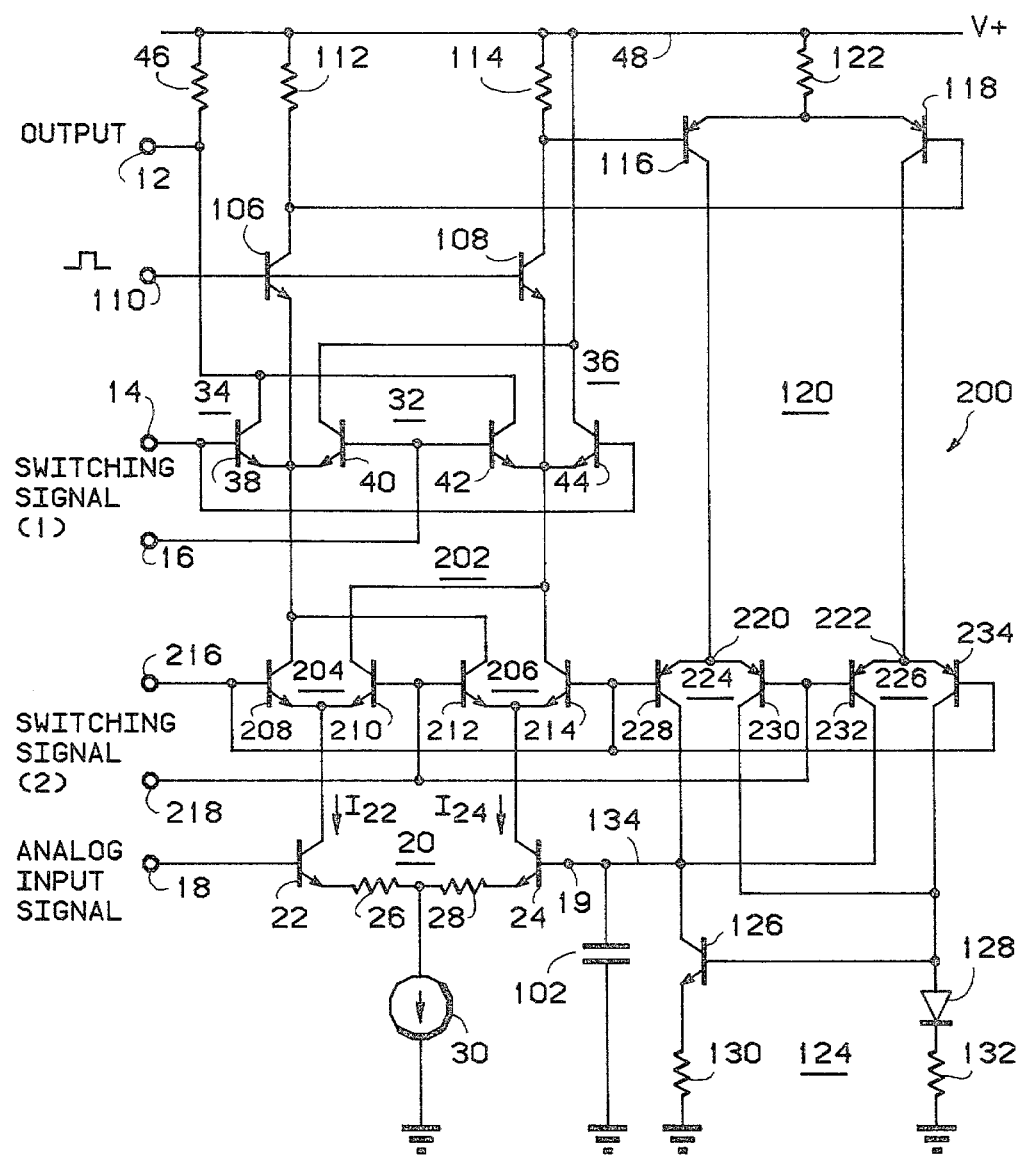
FIG. 3 is a detailed schematic diagram of the preferred embodiment of the present invention.

The major source of errors that might be associated with the aforedescribed method for nulling the output signals are caused by resistors 112 and 114 being of different magnitude. If the ratio of the resistors 112 and 114 is not equal to one, the difference causes an error which is directly translated in the current ratio therebetween. Turning now to FIG. 3 the preferred embodiment of the present invention is illustrated for providing the nulling of the output signal as aforedescribed while eliminating the errors established due to resistor tolerance values of resistors 112 and 114.

As before, components in FIG. 3 have the same reference numerals of like components in FIG. 2 and FIG. 1. Balanced modulator 200 of the preferred embodiment of the present invention is shown as including differential input amplifier section 20 and multiplier section 32 wherein the respective outputs of multiplier section 32 are coupled to the emitter electrodes of transistor gates 106 and 108 as previously described with respect to FIG. 2. However, as shown there is added a second multiplier section 202 including transistor pairs 204 and 206. Transistor pair 204 includes transistors 208 and 210, and transistor pair 206 includes transistors 212 and 214. The emitters of transistors 208 and 210 are coupled to the collector of transistor 22 with the emitters of transistors 212 and 214 being coupled to the collector of transistor 24. The collectors of transistors 208 and 212 are interconnected to the emitters of transistors 38 and 40. The collectors of transistors 210 and 214 are interconnected to the emitters of transistors 42 and 44. The bases of transistors 208 and 214 are interconnected to terminal 216 with the bases of transistors 210 and 212 being interconnected to terminal 218. A second switching signal is applied across terminals 216 and 218. The collectors of transistors 116 and 118 of differential amplifier 120 are coupled respectively to the differentially connected nodes 220 and 222 of transistor pairs 224 and 226. Transistor pair 224 includes transistors 228 and 230 wherein the emitters are connected to node 220. Transistor pair 226 comprises transistors 232 and 234 having emitters interconnected at node 222. The collectors of transistors 228 and 232 are interconnected to the collector of transistor 126 of current mirror circuit 124. In a like manner, the collectors of transistors 230 and 234 are interconnected to the anode of diode 128 of current mirror 124. The bases of transistors 228 and 234 are interconnected to terminal 216 with the bases of transistors 230 and 232 interconnected to terminal 218 such that the respective transistors are rendered conductive and nonconductive in response to the second switching signal (2) supplied at terminals 216 and 218.

As previously described, transistors 38–44 of multiplier section 32 are driven appropriately by the first switching signal applied at terminals 14 and 16, during normal operation to commutate the collector currents of transistors 22 and 24 to output terminal 12. During the adjustment cycle, a pulse is applied at terminal 110 to render transistors 106 and 108 conductive whereby the output currents from transistors 22 and 24 are conducted through these two transistors and, hence, through resistors 112 and 114. Transistors 228–234 of transistor pairs 224 and 226, which are driven appropriately by the second switching signal, commutate the output collector currents of transistors 116 and 118 between capacitor 102 and current mirror 124.

In order to provide an explanation of the operation of the circuit of FIG. 3 it is supposed that the currents in transistors 22 and 24 of input differential amplifier 20 are I22 and I24 respectively and that during a time interval t1 they are commutated to flow through resistors 112 and 114 respectively and during a time interval t2 through resistors 114 and 112 respectively. During interval t1 the voltage developed between the base electrodes of transistors 116 and 118 will be given by the equation:

$$V(t1) = I22 \cdot R112 - I24 \cdot R114$$

This voltage during interval t1 will cause a current:

$$g(I22 \cdot R112 - I24 \cdot R114)$$

to flow into capacitor 102, where g is the transfer admittance of amplifier 120, transistor pairs 224, 226, and current mirror 124 during time interval t1. (It is assumed that operation of modulator 200 is linear for simplification).

During time t2 the voltage developed between the base electrodes of transistors 116 and 118 of amplifier 120 is equal to:

$$V = I24 \cdot R112 - I22 \cdot R114$$

Causing a current:

$$-g(I24 \cdot R112 - I22 \cdot R112)$$

to flow into capacitor 102, since the phase of the transfer admittance is reversed during interval t2 by the commutating action of transistor pairs 224 and 226.

The average current flow into capacitor 102 during the period $t1 + t2$ is:

$$\frac{g}{t1+t2}[t1(I22 \cdot R112 - I24 \cdot R114) - t2(I24 \cdot R112 - I22 \cdot R114)] = \frac{g}{t1+t2}[I22(R114 \cdot t2 + R112 \cdot t1) - I24(R112 \cdot t2 + R114 \cdot t1)]$$

If it is assumed that the foregoing is zero (high loop gain) the ratio between I22 and I24 is given by:

$$\frac{I22}{I24} = \frac{R112 \cdot t2 + R114 \cdot t1}{R114 \cdot t2 + R112 \cdot t1}$$

Now, supposing t2 equals t1 plus δt, then the ratio I22 over I24 equals $$\frac{I22}{I24} = \frac{(R112+R114)t1 + \delta t\, R112}{(R112+R114)t1 + \delta t\, R114}$$

$$= \frac{1 + \frac{\delta t}{t1} \frac{R112}{R112+R114}}{1 + \frac{\delta t}{t1} \frac{R114}{R112+R114}}$$

From the above it is seen that I22, I24 are equal regardless of any difference between resistors 112 and 114 of δt is zero, i.e., if the commutating waveform is of 50% duty cycle. It is also seen that the commutation will always reduce the error even if the duty cycle is not 50%. For duty cycles near 50% (δt/t1 is substantially less than 1) we can write the error component as:

$$\frac{I22}{I24} - 1 = \frac{\delta t}{t1} \frac{R112 - R114}{R112 + R114}$$

From the above, it is clearly recognized that the overall error is equal to the product of the resistor ratio and the duty cycle errors. Very little errors are thus obtained without requiring a high precision of matching tolerance between the resistors and the timing intervals.

For application in Secam chroma demodulator systems the commutating frequencies (switching signals 1 and 2) are conveniently made at half the line time base frequency and the adjustment cycle period of two consequtive lines per frame can be utilized. It is further recognized that other than during the adjustment period the commutation may be left operational or blocked in a defined state according to the overall system requirements.

I claim:

1. A self balancing modulator for providing a zero output signal in response to an applied input signal being at a zero reference level, comprising:

a first differential amplifier having first and second inputs and first and second outputs, said first input being adapted to receive the applied input signal, said second input being adapted to receive a variable bias potential;

first switching circuit means coupled with said first and second outputs of said first differential amplifier and receiving a first switching signal for commutating the output signals appearing at said first and second outputs of said first differential amplifier to an output of the modulator;

feedback means responsive to input signals applied thereto for varying said bias potential supplied to said first differential amplifier to balance the output signals from said first differential amplifier; and gating switch means coupled between said first and second outputs of said first differential amplifier and respective inputs of said feedback means, said gating switch means being responsive to a control signal for supplying said input signals to said feedback means, said control signal being supplied concurrently with the input signal to said first differential amplifier being at a zero reference level such that said output signals therefrom are balanced to provide a zero output signal.

2. The self balancing modulator of claim 1 comprising second switching circuit means, said second switching circuit means being coupled between said first and second outputs of said first differential amplifier and said first switching circuit means for commutating said output signals from said first differential amplifier to said first switching means in response to a second switching signal being applied thereto.

3. The self balancing modulator of claim 1 wherein said feedback means includes:

a second differential amplifier having first and second inputs and outputs respectively, said first and second inputs being coupled with said gating switch means; and differential to single ended output means coupled between said first and second outputs of said second differential amplifier and said second input of said first differential amplifier for varying the level of said bias potential accordingly in response to the output signals appearing at said first and second outputs of said second differential amplifier.

4. The self balancing modulator of claim 2 including third switching circuit means coupled between said first and second outputs of said second differential amplifier and said differential to single ended output means which is responsive to said second switching signal for commutating said output signals from said second differential amplifier to said differential to single ended output means.

5. The self balancing modulator of claim 3 or 4 wherein said gating switch means includes:

a first transistor having first, second and control electrodes, said first electrode being coupled to said first output of said first differential amplifier, said second electrode being coupled to said first input of said second differential amplifier; and a second transistor having first, second and control electrodes, said first electrode being coupled to said second output of said first differential amplifier, said second electrode being coupled to said second input of said second differential amplifier, said control electrode being coupled to said control electrode of said first transistor and to a first terminal at which is supplied said control signal.

6. The self balancing modulator of claim 5 wherein:

said second electrodes of said first and second transistors each being coupled respectively to a second terminal at which is provided a source of operating potential;

said first switching circuit means being coupled to said second terminal; and said second differential amplifier being coupled to said second terminal.

7. The self balancing modulator of claim 6 including a charge storage device being coupled with said second input of said first differential amplifier, said charge storage device being charged and discharged accordingly by said feedback means for varying the bias potential appearing at said second input of said first differential amplifier.

8. The self balancing modulator of claim 4 including a charge storage device being coupled with said second input of said first differential amplifier, said charge storage device being charged and discharged accordingly by said feedback means for varying the bias potential appearing at said second input of said first differential amplifier.

9. A self balancing modulator having an input and an output, and including an input differential amplifier adapted to receive an analog input signal supplied at one input and a bias potential supplied at a second input thereof, a first switching circuit adapted to receive a first switching signal supplied thereto, the first switching circuit being coupled between a load and the differential outputs of the input differential amplifier for commutating output currents from the input differential amplifier to said load in response to the first switching signals, the load being coupled to the output of the modulator, the improvement comprising:

a pair of transistor gating switches having respective collector-emitter paths coupled in series between the differential outputs of the input differential amplifier and a pair of respective resistors, the base electrodes of said pair of transistors being adapted to receive a control signal for shunting the output currents through said resistors; a feedback circuit having respective inputs coupled to said resistors and an output, said output being adapted to be coupled to a charge storage device and the input differential amplifier at the second input thereof, said feedback circuit providing an output signal for varying the charge stored by said charge storage device in accordance with the voltage developed across said resistors such that the bias potential equalizes the output currents from the input differential amplifier to null said output signal when said control signal is supplied and the analog input signal is set to a nominal zero setting.

10. The self balancing modulator of claim 9 wherein said feedback circuit includes a differential amplifier having differential inputs and outputs; said inputs being coupled to a respective one of said pair of resistors; and a current mirror circuit coupled to said outputs of said differential amplifier to provide said output signal at an output of said feedback circuit to said charge storage device.

11. The self balancing modulator of claim 10 further including:
a second switching circuit adapted to receive a second switching signal, said second switching circuit being coupled between the outputs of the input differential amplifier and the first switching circuit for commutating said differential output currents from the input differential amplifier to the first switching circuit during normal operation; and a third switching circuit adapted to receive the second switching signal and being coupled between said differential amplifier outputs and said current mirror circuit for commutating the output currents therefrom to said current mirror circuit in synchronism with the second switching circuit.

12. The self balancing modulator of claim 11 wherein each of said switching circuits comprising first and second transistor pairs, each of said transistor pairs including first and second transistors differentially connected at respective emitters with the collectors of the first transistors of each transistor pair being interconnected, the collectors of the second transistors of each transistor pair being interconnected, the base of the first transistor of the first transistor pair being interconnected with the base of the second transistor of the second transistor pair to a first terminal, the bases of the second and first transistors of the first and second transistor pair respectively being interconnected at a second terminal, and the respective switching signal being applied to the first and second terminal of respective switching circuits.

13. For a chroma demodulator section of a television receiver, a self balancing modulator having an input adapted to receive an analog signal, and an output at which is provided a modulated output signal, the self balancing modulator including an input differential amplifier having first and second inputs and first and second outputs, the first input being coupled to the input of the modulator, the second input being adapted to receive a bias potential, and a first switching circuit coupled between a load and the first and second outputs of the input differential amplifier, the first switching circuit being adapted to receive a first switching signal for commutating the differential currents flowing in the outputs of the input differential amplifier through the load, the load being coupled to the output of the modulator such that the analog signal appears thereat modulated by the first switching signal, the improvement comprising:
the self balancing modulator including a second switching circuit receiving a second switching signal and being coupled between the outputs of the input differential amplifier and the first switching circuit; a first and second gating transistor, the collector-emitter paths of said first and second gating transistors being connected, respectively, in series between first and second outputs of said second switching circuit and respective resistors, the bases of said first and second gating transistors being coupled to a terminal at which is supplied a gating pulse whereby the differential currents from the input differential amplifier are shunted to said respective resistors when said first and second gating transistors are rendered conductive by said gating pulses; and a feedback circuit having first and second inputs and an output, said inputs coupled respectively to said resistors, said output being coupled to the second input of said input differential amplifier, said feedback circuit being rendered active in response to a differential bias signal developed across said resistors when said first and second gating transistors are rendered conductive to vary the bias potential to the second input of the input differential amplifier in order to null the output signal during the intervals when gating pulses are supplied to the self balancing modulator and the analog signal is set at a nominal zero level.

14. The self balancing modulator of claim 13 wherein said feedback circuit includes a differential amplifier having first and second inputs and outputs, said first and second inputs being coupled to respective ones of said resistors; a current mirror circuit coupled to the first and second outputs of said differential amplifier for deriving the bias potential at said output of said feedback circuit.

15. The self balancing modulator of claim 14 wherein said feedback circuit further includes a third switching circuit adapted to receive said second switching signal and being coupled between said first and second outputs of said differential amplifier and said current mirror for commutating differential output currents from said differential amplifier to said current mirror in synchronism with said second switching circuit.

16. The self balancing modulator of claim 15 wherein said output of said current mirror circuit is coupled to a capacitor across which the bias potential is provided.

* * * * *